United States Patent [19]
Adcock et al.

[11] Patent Number: 5,001,660
[45] Date of Patent: Mar. 19, 1991

[54] WAVEFORM GENERATION METHOD USING STORED COMPLEX DATA

[75] Inventors: James L. Adcock; David E. Shoup, both of Seattle, Wash.

[73] Assignee: Hewlett-Packard Company, Palo Alto, Calif.

[21] Appl. No.: 345,264

[22] Filed: Apr. 27, 1989

[51] Int. Cl.⁵ .............................................. G06F 1/02
[52] U.S. Cl. .................................... 364/721; 364/718
[58] Field of Search ................ 364/721, 720, 719, 718

[56] References Cited

U.S. PATENT DOCUMENTS

| | | | |
|---|---|---|---|
| 4,171,466 | 10/1979 | Carbrey | 179/15 BY |
| 4,227,248 | 10/1980 | Munter | 370/110 |
| 4,498,171 | 2/1985 | Munter et al. | 370/110.2 |
| 4,718,030 | 1/1988 | Tsutsumi | 364/721 |
| 4,758,971 | 7/1988 | Wright | 364/721 |
| 4,797,844 | 1/1989 | Jackson | 364/724.01 |
| 4,881,191 | 11/1989 | Morton | 364/724.13 |
| 4,891,778 | 1/1990 | Baseghi et al. | 364/721 |
| 4,893,316 | 1/1990 | Janc et al. | 364/721 |

OTHER PUBLICATIONS

Balakrishnan, Shiv, "A Real-Time Digital Mixer IC," ICASSP 86, IEEE, 1517-1520, 1986.

*Primary Examiner*—David H. Malzahn

[57] ABSTRACT

A digital mixer is supplied with two digitized input signals in complex form. The product of the complex input signals is converted to analog form and provides the desired output signal without any alias terms. The first input signal is desirably stored in a first memory as a sequence of data points corresponding to a complex exponential sinusoid. The second input signal is a baseband excitation waveform that is also stored in complex form in a memory. Operands from these two sources are provided periodically to the mixer for complex multiplication. The sequence of sinusoid operands provided from the first memory is determined by a phase counter that indexes through the memory by a $\Delta\theta$ term. $\Delta\theta$ is selected so that the data indexed thereby corresponds to samples of a sine wave of the desired frequency. If $\Delta\theta$ indexes a signal phase intermediate two complex data in the memory, an interpolated value is provided.

14 Claims, 3 Drawing Sheets

WAVEFORM GENERATION METHOD USING STORED COMPLEX DATA

FIELD OF THE INVENTION

The present invention relates to signal generation, and more particularly relates to a method and apparatus for generating a signal by translating a waveform to a desired frequency using a complex digital mixer.

BACKGROUND AND SUMMARY OF THE INVENTION

Laboratory instruments, such as network and spectrum analyzers, often include signal sources to electrically excite a system being measured. These sources can usually provide a variety of signals, such as sinusoids, chirps, noise, etc, at a desired frequency of interest.

In the early prior art, these signals were generated by analog mixers which upconverted a baseband analog waveform, such as a chirp, to a desired frequency of interest by mixing with a signal from an analog local oscillator. The resulting product included both sum and difference terms, one of which was undesired and required filtering. The filtering task was difficult due to the wide range of different signals the instrument could produce.

More recently, designers of some instruments have adopted digital techniques for signal generation. Digital signal generation offers several advantages, one of which is the ability to simply and precisely set signal frequencies under microprocessor control. It also permits use of digital filters that can be reconfigured as necessary to eliminate spurious products from the mixing process.

While advantageous in many respects, digital signal generation as presently practiced has certain drawbacks. It is an object of the present invention to overcome these drawback to provide a highly accurate signal source that can be economically implemented and provide great flexibility in the number of different waveforms that can be generated.

According to the present invention, a digital mixer is supplied with two digitized input signals in complex form. The product of the complex input signals is converted to analog form and provides the desired output signal without any alias terms.

In one embodiment of the invention, the first input signal is stored in a first memory as a sequence of data points corresponding to a complex exponential sinusoid, or a representative portion thereof. The second input signal is a baseband excitation waveform that is downloaded in complex form into a random access memory. Operands from these two sources are provided periodically to the digital mixer for complex multiplication. The multiplication of the digital representation of the complex sinusoid with the digital representation of a baseband excitation waveform yields a resultant digital data stream that corresponds to the baseband waveform shifted up in frequency. The process is analogous to single sideband modulation of analog signals.

The sequence of sinusoid operands provided from the first memory is determined by a phase counter that indexes through the sinusoid memory by a $\Delta\theta$ term. $\Delta\theta$ is selected so that the data indexed thereby corresponds to samples of a sine wave of the desired frequency. If $\Delta\theta$ indexes a signal phase intermediate two complex data in the memory, an interpolated value is provided to the mixer.

The foregoing and additional objects, features and advantages of the present invention will be more readily apparent from the following detailed description, which proceeds with reference to the accompanying drawings.

DETAILED DESCRIPTION

To provide a comprehensive disclosure without unduly lengthening this specification, applicants incorporate by reference the specification of allowed Morton U.S. Pat. No. 4,811,191 and assigned to the present assignee, which provides background material relevant to the present invention.

Figure 1:
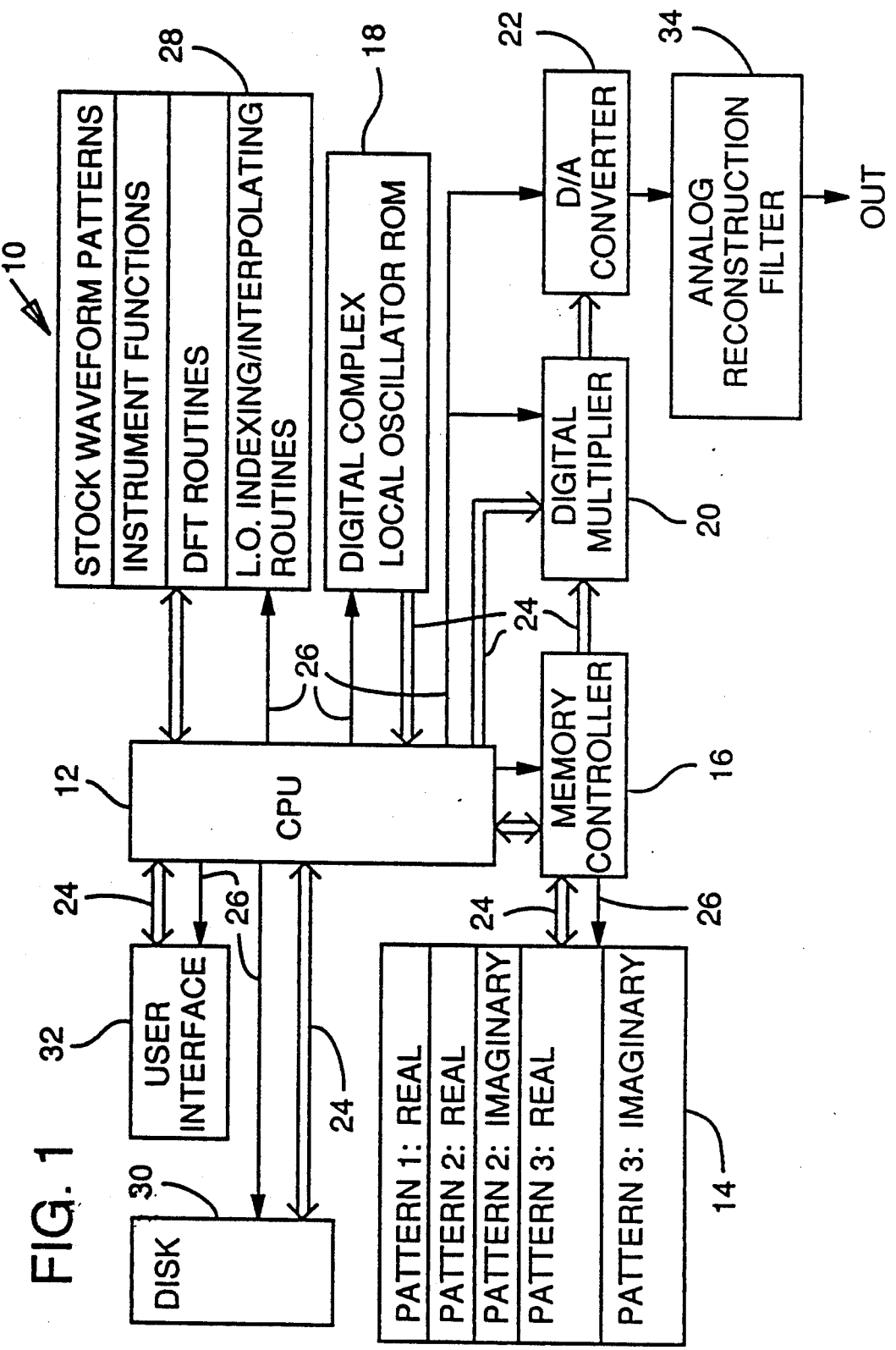
FIG. 1 is a schematic block diagram of an apparatus according to one embodiment of the present invention.

FIG. 1 is a schematic block diagram of a signal generator apparatus 10 according to one embodiment of the present invention. It includes a control microprocessor 12 with associated memory and I/O, a pattern memory 14, a pattern memory controller 16, a digital local oscillator 18, a digital multiplier 20 and a digital-to-analog converter 22. These elements are interconnected by data buses 24 and control lines 26.

The control microprocessor 12 in the illustrated embodiment is a Motorola 68000 series CPU that controls most of the functions of a host instrument in which the signal generator 10 is embodied. Associated with CPU 12 is a memory 28 in which I/O and instrument operation routines are stored. Also included in this memory is a routine illustrated in FIG. 3 and discussed below for indexing through data in a ROM local oscillator sine-/cosine table and for interpolating and negativing this data as necessary to yield multiplicands for a complex mixing process.

Pattern memory 14 is a static RAM that can be loaded with complex samples of a desired baseband signal. In the illustrated embodiment, the pattern memory is shown as storing three patterns, two complex and one purely real. Complex patterns are stored as two patterns, one real and one imaginary. These patterns can be loaded in from an external disk 30 or can be manually defined through a user interface 32. In another embodiment, commonly used, stock waveform patterns are permanently stored in the microprocessor's program ROM 28 and are selectively downloaded into RAM 14 as required. In still another embodiment, a routine in the microprocessor memory 28 may permit the CPU to algorithmically generate complex patterns which then can be loaded into the pattern memory 14. One such pattern is a chirp signal that is flat in the frequency domain, as described in application Ser. No. 344,777 entitled METHOD AND APPARATUS FOR GENERATING A CHIRP SIGNAL filed simultaneously herewith and assigned to the present assignee. Another such pattern is a noise sequence that is flat in the frequency domain, as described in application Ser. No. 344,190 entitled FILTER AND METHOD FOR WHITENING DIGITALLY GENERATED NOISE, also filed simultaneously herewith and assigned to the present assignee. These disclosures are incorporated herein by reference.

Control microprocessor 12 can be used to control all aspects of the pattern memory's operation. However, in the preferred embodiment, additional memory controller circuitry 16 is provided to reduce the processing burden on the CPU. This controller circuitry includes several subcircuits, such as a Source Address Register, a DMA Load Counter, a RAM Run Counter, a Data Register and an End of Cycle Detector.

The Source Address Register indicates to the CPU the base address in pattern memory 14 at which to begin loading incoming pattern data. The DMA Load Counter indexes from this base address to indicate the successive memory locations in which bytes of an incoming pattern are to be stored. The Memory Run Counter performs the analogous function during the reading of the pattern from the pattern memory, indexing successive locations in memory from which pattern samples are to be read. The Data Register holds incoming pattern data that is be loaded into the pattern RAM until the RAM is ready to allow the transfer. This register permits the RAM to output a pattern without delaying the CPU if the CPU simultaneously needs to download a new pattern into the RAM. Finally, the End of Cycle Detector selects the length of the pattern that is to be read from the pattern memory. In the illustrated embodiment, the waveform pattern stored in RAM can be 256 to 32768 points long, in powers of two. When the End of Cycle Detector indicates that a complete waveform has been played back, a variety of operations can be initiated. The waveform can start playing back again from the beginning, causing a repetitive signal to be generated. Alternatively, the waveform can be turned off, causing a "single shot" or transient waveform. Still further, a signal can be sent to the CPU 12 to trigger execution of another function.

Pattern data output from the memory 14 is provided to a digital multiplier 20 that multiplies the pattern data stream with a data stream corresponding to a complex sinusoid from local oscillator 18. Local oscillator 18 is a ROM based source that operates in conjunction with CPU 12 to provide a local oscillator data stream, as described more fully below. The mixing of these two data streams serves to translate the baseband waveform pattern to a higher frequency.

The digital data stream output from the multiplier 20 is converted to analog form using a digital-to-analog converter (DAC) 22. Since the DAC holds each sample for a finite time period (corresponding to the apparatus's 262,144 Hz sampling rate), a $\sin(x)/x$ term is introduced into the output signal's frequency spectrum. This ripple is removed by an analog reconstruction filter 34 dedicated to this particular function. Filter 34 also serves to suppress sidebands and harmonics of the desired output signal. The filtered analog signal is then output from the instrument for application to the system under test.

In some embodiments, the digitized baseband waveform data stored in pattern RAM 14 may produce its own $\sin(x)/x$ ripple in the output signal—a ripple that the analog reconstruction filter 34 is not designed to remove. Such a ripple may be caused by reading data from the pattern RAM at a rate slower than the nominal 262,144 Hz clock speed at which the local oscillator data stream is provided, or may be caused by the finite duration of the waveform. In the preferred embodiment, such ripples are removed from the pattern data prior to mixing in multiplier 20. In one embodiment, the ripple is removed by a digital filtering stage is interposed between the RAM pattern memory 14 and the digital mixer 20. In another embodiment, the ripple is avoided altogether by preprocessing the pattern data prior to its storage in the RAM. Such preprocessing techniques are disclosed, for example, in the copending application entitled METHOD AND APPARATUS FOR GENERATING A CHIRP SIGNAL reference above. One such preprocessing technique consists of generating a sequence of samples corresponding to a flat chirp in the frequency domain according to the formula $e^{jk\omega^2}$ and performing a finite inverse Fourier transform on the sequence to find its counterpart in the time domain. Another preprocessing technique comprises dividing the frequency domain representation of a waveform by a $\sin(x)/x$ factor that will be introduced into the waveform if it is read out from the RAM memory 14 at a rate below the nominal 262,144 hertz rate. It is this preprocessed data that is stored in the pattern memory 14.

As described in greater detail below, the local oscillator data is read from local oscillator ROM 18 at a rate of 262,144 Hz. Since the multiplier 20 is desirably provided with data from both the pattern RAM and the local oscillator ROM simultaneously, the data from the pattern RAM should be provided at the same rate, or at a rate integrally related thereto. If the pattern RAM 14 provides data samples at a rate slower than local oscillator ROM, the pattern RAM should hold its output constant for several of the higher speed (i.e. 262,144 Hz) clock cycles. By this arrangement, a single output datum from the pattern RAM may be sequentially mixed with two or more data from the local oscillator.

This speed at which samples are read from the pattern memory 14 is controlled directly by the CPU 12 and determines both the bandwidth and the period of the baseband waveform. In the illustrated embodiment, the pattern memory can be read at clock rates that are related by powers of two, i.e. 131,072 Hz, 65,536 Hz, 32,768 Hz, etc.

As noted above, local oscillator (LO) 18 is principally comprised of a ROM memory in which samples of a complex sinusoid are stored. To permit the most accurate quantification of the sinusoid within a given memory size, only one quadrant of the complex waveform is stored: the quadrant extending from 0 to $\pi/2$. Waveform samples for the portion of the cycle that extends from $\pi/2$ to $2\pi$ are obtained as follows:

if the phase $\theta$ is between $\pi/2$ and $\pi$, then the complex LO datum corresponding to $(\pi-\theta)$ is read and the imaginary part is negatived;

if the phase is between $\pi$ and $3\pi/2$, then the complex LO datum corresponding to $(\theta-\pi)$ is read and both the real and imaginary parts are negatived; thereof; and if the phase is between $3\pi/2$ and $2\pi$, then the complex LO datum corresponding to $(2\pi-\theta)$ is read and the real part is negatived.

Figure 2:
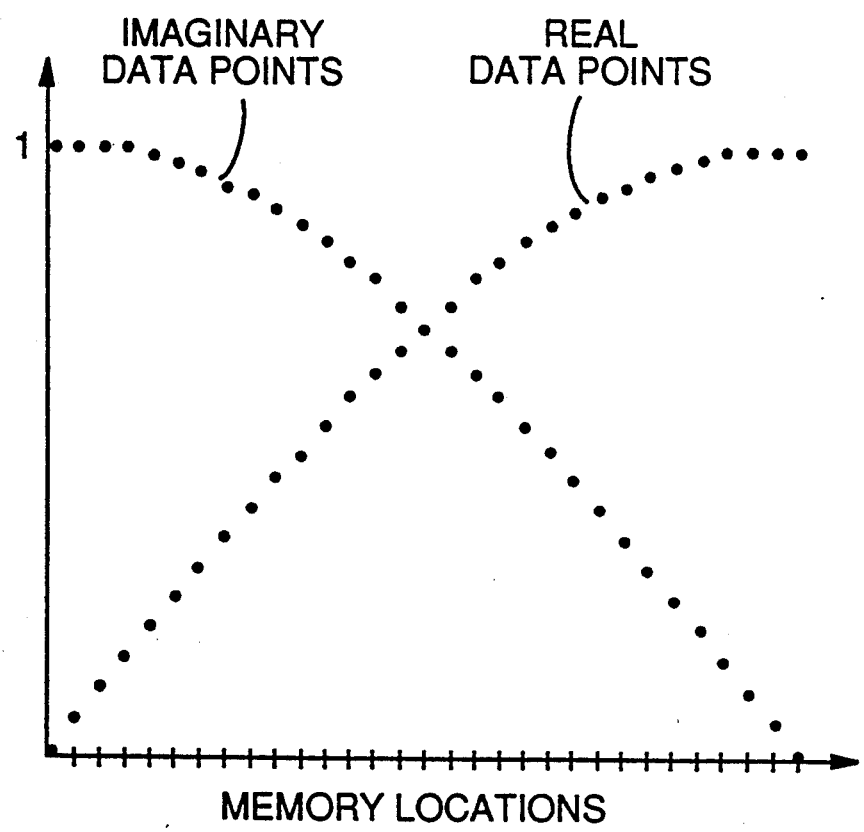
FIG. 2 is a simplified diagram illustrating the real and imaginary sinusoid data points stored in ROM in the apparatus of FIG. 1.

FIG. 2 illustrates the real and imaginary samples stored in a simplified system in which data points are spaced uniformly over a 0 to $\pi/2$ radian quadrant. In the preferred embodiment, data points are spaced instead every 0.0001963 radians, resulting in 8000 real data points and 8000 complex data points over this quadrant. Each point is quantified in a 12 bit byte.

Unlike the RAM pattern memory 14, local oscillator ROM memory 18 is not read at different frequencies to produce sinusoids of different frequencies. Instead, samples are always read from the local oscillator ROM at a fixed frequency, namely 262.144 KHz. Sinusoids of different frequencies are produced by indexing through the sampled data instead of reading it sequentially. The particular sequence of samples read from the ROM is determined by a phase counter implemented in the CPU 12 that indexes through the data by a $\Delta\theta$ term to determine the waveform's cumulative phase $\theta_{TOT}$. $\Delta\theta$ is selected so that the data indexed thereby corresponds to samples of a sine wave of the desired frequency. The CPU 12 calculates $\Delta\theta$ by the formula $\Delta\theta = 2\pi(F_{DESIRED} * T_{CLOCK})$, where $F_{DESIRED}$ is the frequency desired to be generated and $T_{DESIRED}$ is the clock period at which data is read from the ROM, (3.8146972 microseconds in the illustrated 262.144 KHz clock system).

To produce a sinusoid at 2237.89 hertz, for example, the $\Delta\theta$ term is computed by the above formula to be 0.0536389 radians. Since the sinusoid data points are spaced by 0.0001963 radians, a single $\Delta\theta$ increment of 0.0536389 radians corresponds to 273.25 data points. Consequently, the CPU 12 reads from the ROM 18 a sequence of complex sinusoid data points at memory locations 0, 273.25, 546.5, 819.75, 1093, 1366.25, etc., up through the 8000 points stored in memory. (While this sequence starts at location 0, it will be recognized that other sequences could start at other locations.) After the first $\pi/2$ quadrant is exceeded, the process continues up through $2\pi$, with the complex operands in the first quadrant being read from memory and processed as described above to translate them to the proper quadrant. After the cumulative phase $\theta_{TOT}$ exceeds $2\pi$, the CPU subtracts $2\pi$ from the value to bring it back into the 0 to $2\pi$ range.

In the above example, as in most, the $\Delta\theta$ term will sometimes index a fractional memory location (i.e. a signal phase intermediate two data points in the memory). In such cases, the CPU 12 interpolates between the two nearest data points to provide a more accurate output datum. In simpler embodiments the interpolation is linear. In more complex embodiments, the CPU performs a higher order approximation using data points beyond the two nearest.

Figure 3:
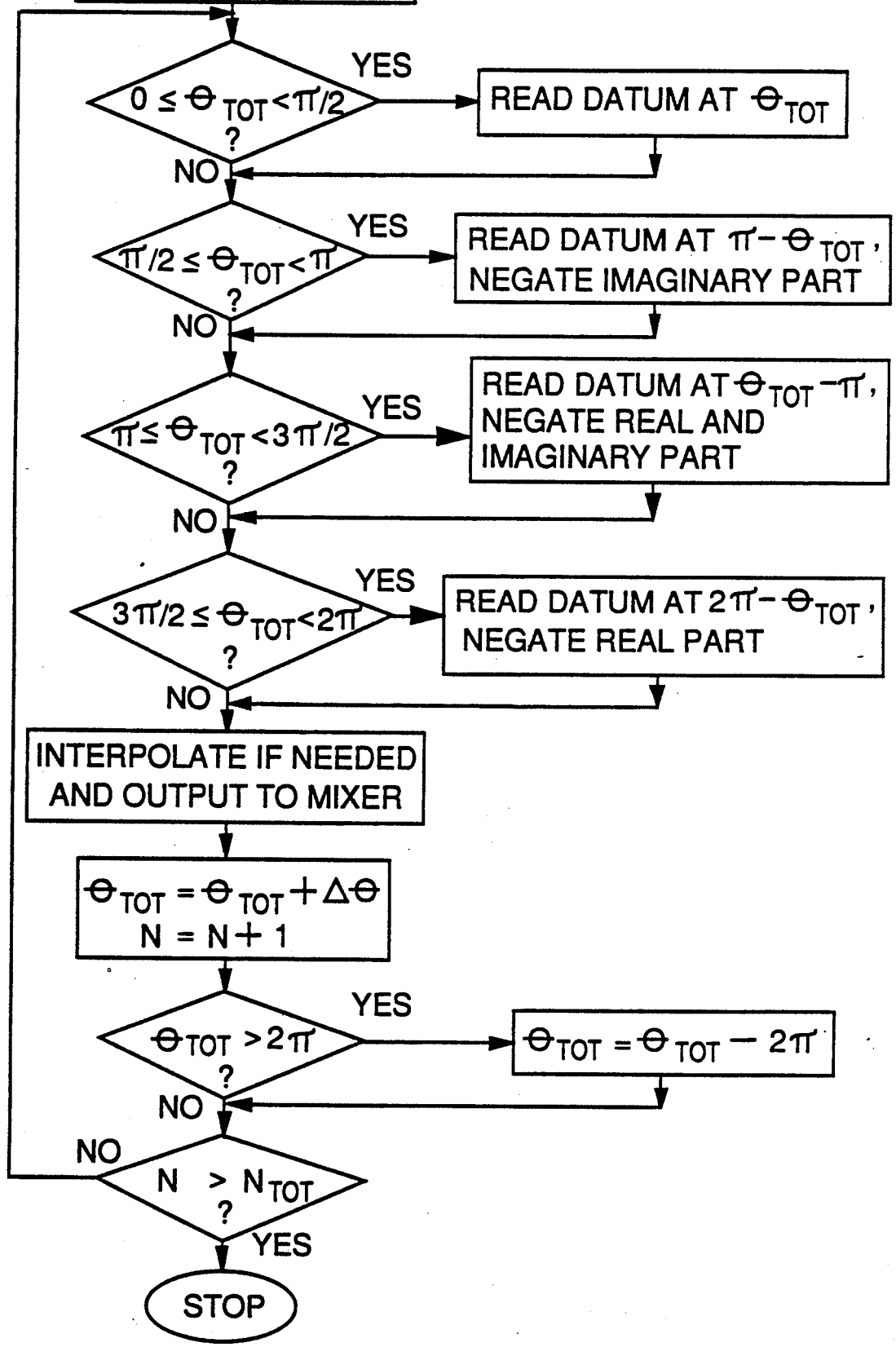
FIG. 3 is a simplified flow chart of a phase indexing scheme using the apparatus of FIG. 1.

The above-described phase indexing scheme is illustrated by the flowchart of FIG. 3. A microprocessor routine embodying this scheme is stored in the microprocessor's program memory 28.

By the foregoing arrangement, the local oscillator 18 is able to provide highly accurate sampled complex sinusoids at virtually any frequency between −128 KHz and 128 KHz in steps of 0.015 hertz. The use of a complex local oscillator data stream in the mixing process prevents the production of undesired alias components in the output signal spectrum.

It will be recognized that the apparatus of FIG. 1 can be operated to provide a multitude of waveforms, such as burst chirps, burst noise, square waves, triangle waves, user-shapes waveforms, etc. dependent on the baseband waveform data loaded into the pattern memory 14. The mixer 20 allows precision translation of these baseband signals up to any frequency desired. If it is desired to produce a pure sinusoid, the CPU disables the pattern memory 14 and outputs from the sine ROM 18 just the real part of the complex sinusoid data.

Having described and illustrated the principles of our invention with reference to a preferred embodiment thereof, it will be apparent that the invention can be modified in arrangement and detail without departing from such principles. Accordingly, we claim as our invention all such modifications as may come within the scope and spirit of the following claims and equivalents thereto.

We claim:

1. A method of signal generation comprising the steps:
storing in a local oscillator memory a sequence of pattern data representing a sine wave in complex form;
selecting a desired sine wave frequency;
providing from the local oscillator memory a first digital data stream representing a sine wave at said desired sine wave frequency in complex form;
storing in a pattern memory a sequence of pattern data representing a plurality of waveforms in complex form;
selecting a desired one of said plurality of waveforms;
selection a desired frequency for the desired waveform;
providing from said pattern memory a second digital data stream representing said desired waveform at a said desired waveform frequency in complex form;
digitally multiplying the first and second digital data streams to produce a third digital data stream representing their complex product; and
converting said complex product from digital to analog form.

2. The method of claim 1 which further includes:
storing in the local oscillator memory digital data that correspond to a representative portion of a complex sine wave a N different phases thereof;
reading a first complex datum from said local oscillator memory at a memory location corresponding to an initial phase of the signal;
determining a phase increment $\Delta\theta$ by which successive data can be periodically read from said local oscillator memory with a period $T_1$ to yield samples of a sine wave of the desired sine wave frequency; and
periodically reading successive complex data from local oscillator memory locations corresponding to successive phases of the signal with the period $T_1$, where each successive phase is determined by incrementing the prior phase by the phase increment to obtain a cumulative phase $\theta_{TOT}$.

3. The method of claim 2 in which the determining step includes computing $\Delta\theta = 2\pi$(desired sine wave frequency * $T_1$).

4. The method of claim 2 in which the local oscillator memory has N locations in which are stored digital data that correspond to a portion of a complex sine wave extending from an initial phase $\theta_O$ to a final phase $\theta_N$ and which further includes the step of processing said data as necessary to yield complex data representative of a complex sine wave at phases outside of the range $\theta_O$ to $\theta_N$.

5. The method of claim 4 in which $\theta_O$ is 0 radians and $\theta_N$ is $\pi/2$ radians and in which the processing step includes:
if the cumulative phase $\theta_{TOT}$ exceeds $2\pi$, then reducing the cumulative phase into the range of 0 to $2\pi$ by subtracting $2\pi$ radians therefrom;
if the cumulative phase is between 0 and $\pi/2$, then reading the complex datum corresponding thereto from the corresponding location in memory;

if the cumulative phase is between $\pi/2$ and $\pi$, then reading the complex datum corresponding to $(\pi - \theta_{TOT})$ from memory and negativing the imaginary part thereof;

if the cumulative phase is between $\pi$ and $3\pi/2$, then reading the complex datum corresponding to $(\theta_{TOT} - \pi)$ from memory and negativing the real and imaginary parts thereof; and if the cumulative phase is between $3\pi/2$ and $2\pi$, then reading the complex datum corresponding to $(2\pi - \theta_{TOT})$ from memory and negativing the real part thereof.

6. The method of claim 2 which further includes interpolating between two data in the local oscillator memory if the local oscillator memory does not include a datum corresponding to the cumulative phase.

7. The method of claim 2 in which the providing a second digital data stream step includes:
reading successive data from the pattern memory at a period $T_2$ that yields the desired waveform at the desired waveform frequency, wherein $T_2$ is different than $T_1$.

8. The method of claim 7 in which $T_2$ is an integral multiple of $T_1$.

9. The method of claim 8 which further includes the step of compensating for the $\sin(x)/x$ ripple introduced in the frequency domain when $T_2$ is greater than $T_1$.

10. The method of claim 7 in which the step of reading pattern data is repeated periodically.

11. A method of signal generation comprising the steps:
storing in a local oscillator memory a sequence of pattern data representing a sine wave in complex form;
reading data from the local oscillator memory at a periodic interval $T_1$ and thereby providing a first digital data stream representing a sine wave in complex form;
storing in a pattern memory a sequence of pattern data representing a desired waveform in complex form;
reading data from the pattern memory at a periodic interval $T_2$ and thereby providing a second digital data stream representing said desired waveform in complex form;
digitally multiplying the first and second digital data streams to produce a third digital data stream representing their complex product;
converting said complex product from digital to analog form; and
compensating data stored in at least one of the local oscillator memory or the pattern memory to reduce a $\sin(x)/x$ ripple introduced in the frequency domain by the converting step when $T_2$ is different than $T_1$.

12. The method of claim 11 which further includes the steps:
selecting a desired sine wave frequency;
reading data from the local oscillator memory at a period $T_1$ that is fixed regardless of the desired sine wave frequency; and
reading data from the local oscillator memory by indexing therethrough with an indexing interval that corresponds to the desired sine wave frequency.

13. A method of signal generation comprising the steps:
storing in a local oscillator memory a sequence of pattern data representing a sine wave in complex form;
reading data from the local oscillator memory at a periodic interval $T_1$ and thereby providing a first digital data stream representing a sine wave in complex form;
storing in a pattern memory a sequence of pattern data representing a desired waveform in complex form;
reading data from the pattern memory once at a periodic interval $T_2$ and thereby providing a second digital data stream representing a singe shot of said desired waveform in complex form;
digitally multiplying the first and second digital data streams to produce a third digital data stream representing their complex product;
converting said complex product from digital to analog form; and
compensating data stored in the pattern memory to reduce a $\sin(x)/x$ ripple introduced in the frequency domain by the converting step when the desired waveform is of finite duration.

14. The method of claim 13 which further includes the steps:
selecting a desired sine wave frequency;
reading data from the local oscillator memory at a period $T_1$ that is fixed regardless of the desired sine wave frequency; and
reading data from the local oscillator memory by indexing therethrough with an indexing interval that corresponds to the desired sine wave frequency.

* * * * *

UNITED STATES PATENT AND TRADEMARK OFFICE
CERTIFICATE OF CORRECTION

PATENT NO. : 5,001,660
DATED : March 19, 1991
INVENTOR(S) : James L. Adcock et al.

It is certified that error appears in the above-indentified patent and that said Letters Patent is hereby corrected as shown below:

Column 6, line 19, delete "selection" and insert therefor --selecting--.

Signed and Sealed this

Twenty-third Day of May, 1995

Attest:

BRUCE LEHMAN

Attesting Officer        Commissioner of Patents and Trademarks